(12) United States Patent
Lin et al.

(10) Patent No.: US 9,881,907 B2
(45) Date of Patent: Jan. 30, 2018

(54) AGGREGATION OF SEMICONDUCTOR DEVICES AND THE METHOD THEREOF

(71) Applicant: EPISTAR CORPORATION, Hsinchu (TW)

(72) Inventors: Hsu-Cheng Lin, Hsinchu (TW); Pei-Shan Fang, Hsinchu (TW); Ching-Yi Chiu, Hsinchu (TW); Chun-Chang Chen, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 15/187,231

(22) Filed: Jun. 20, 2016

(65) Prior Publication Data

US 2016/0300822 A1   Oct. 13, 2016

Related U.S. Application Data

(60) Continuation of application No. 14/663,439, filed on Mar. 19, 2015, now Pat. No. 9,397,275, which is a division of application No. 13/910,581, filed on Jun. 5, 2013, now Pat. No. 9,006,756.

(60) Provisional application No. 61/676,206, filed on Jul. 26, 2012.

(51) Int. Cl.
| | |
|---|---|
| H01L 33/00 | (2010.01) |
| H01L 31/00 | (2006.01) |
| H01L 25/075 | (2006.01) |
| H01L 21/82 | (2006.01) |
| H01L 27/15 | (2006.01) |
| H01L 27/14 | (2006.01) |
| H01L 21/683 | (2006.01) |
| H01L 21/66 | (2006.01) |
| H01L 23/544 | (2006.01) |
| H01L 31/048 | (2014.01) |
| H01L 31/18 | (2006.01) |
| H01L 33/54 | (2010.01) |

(52) U.S. Cl.
CPC ...... *H01L 25/0753* (2013.01); *H01L 21/6835* (2013.01); *H01L 21/6836* (2013.01); *H01L 21/82* (2013.01); *H01L 22/22* (2013.01); *H01L 23/544* (2013.01); *H01L 27/14* (2013.01); *H01L 27/15* (2013.01); *H01L 31/048* (2013.01); *H01L 31/1876* (2013.01); *H01L 33/0054* (2013.01); *H01L 33/54* (2013.01); *H01L 2221/6834* (2013.01); *H01L 2221/68354* (2013.01); *H01L 2223/54413* (2013.01); *H01L 2223/54433* (2013.01); *H01L 2924/0002* (2013.01); *H01L 2933/005* (2013.01); *H01L 2933/0033* (2013.01)

(58) Field of Classification Search
CPC ..... H01L 27/14; H01L 27/15; H01L 21/6836; H01L 23/544; H01L 25/0753; H01L 33/54
USPC .................................................. 257/88, 443
See application file for complete search history.

(56) References Cited

U.S. PATENT DOCUMENTS

| | | | |
|---|---|---|---|
| 4,477,182 A | 10/1984 | Takanashi et al. | |
| 6,013,538 A * | 1/2000 | Burrows | H01L 27/32 257/40 |
| 7,621,662 B1 | 11/2009 | Colbert | |

(Continued)

*Primary Examiner* — David S Blum
(74) *Attorney, Agent, or Firm* — Patterson + Sheridan, LLP

(57) ABSTRACT

An aggregation of semiconductor devices comprises a first layer, a second layer adhered to the first layer, and a plurality of semiconductor devices arranged between the first layer and the second layer to form a shape, wherein the shape comprises a curve and a mark, and the first layer is flexible.

17 Claims, 2 Drawing Sheets

(56) References Cited

U.S. PATENT DOCUMENTS

| | | |
|---|---|---|
| 7,766,511 B2 | 8/2010 | Zampini et al. |
| 7,935,212 B2 | 5/2011 | Jiang et al. |
| 8,183,585 B2 | 5/2012 | Scotch et al. |
| 2005/0242362 A1 | 11/2005 | Shimizu et al. |
| 2010/0256802 A1 | 10/2010 | Garica et al. |

* cited by examiner

AGGREGATION OF SEMICONDUCTOR DEVICES AND THE METHOD THEREOF

REFERENCE TO RELATED APPLICATION

This application is a continuation application of U.S. patent application Ser. No. 14/663,439, filed Mar. 15, 2015, now U.S. Pat. No. 9,397,275, which is a divisional application of U.S. patent application Ser. No. 13/910,581, filed Jun. 5, 2013, now U.S. Pat. No. 9,006,756, that claims benefit of U.S. provisional patent application Ser. No. 61/676,206, filed Jul. 26, 2012, all of which are incorporated by reference in their entireties.

TECHNICAL FIELD

The present application relates to an aggregation of semiconductor devices and the method thereof.

DESCRIPTION OF BACKGROUND ART

When the semiconductor devices, e.g. light-emitting diodes and solar cell, are delivered, the semiconductor devices have to be sorted by a sorter and arranged in a specific type for the other equipment to pick up thereof. Conventionally, the semiconductor devices are sorted and arranged in a package of which the shape is square, and the equipment usually is able to access the package to pick up the semiconductor devices. But, the package, of which the shape is square, is not economical. Thus, the inventors of the application are motivated to provide a more economical method for carrying more semiconductor services at a time.

SUMMARY OF THE DISCLOSURE

An aggregation of semiconductor devices comprises a first layer, a second layer adhered to the first layer, and a plurality of semiconductor devices arranged between the first layer and the second layer to form a shape, wherein the shape comprises a curve and a mark, and the first layer is flexible.

DETAILED DESCRIPTION OF PREFERRED EMBODIMENTS

Figure 1A:
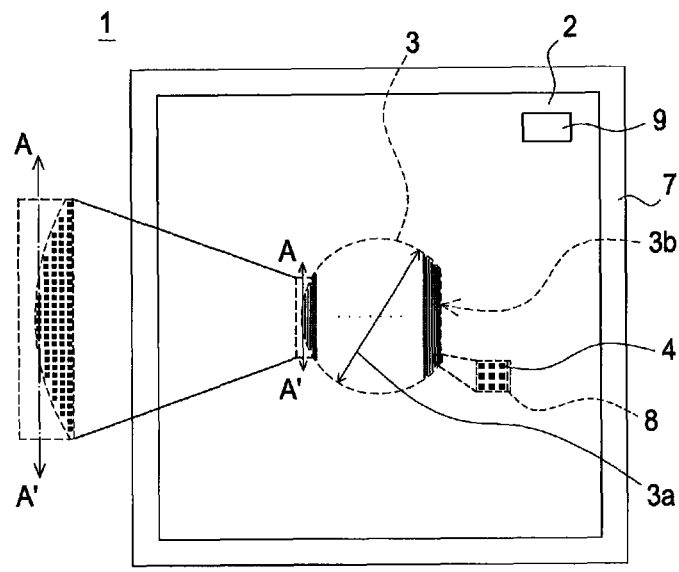
FIGS. 1A~1C show the aggregation of a plurality of semiconductor devices.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

Figure 2:
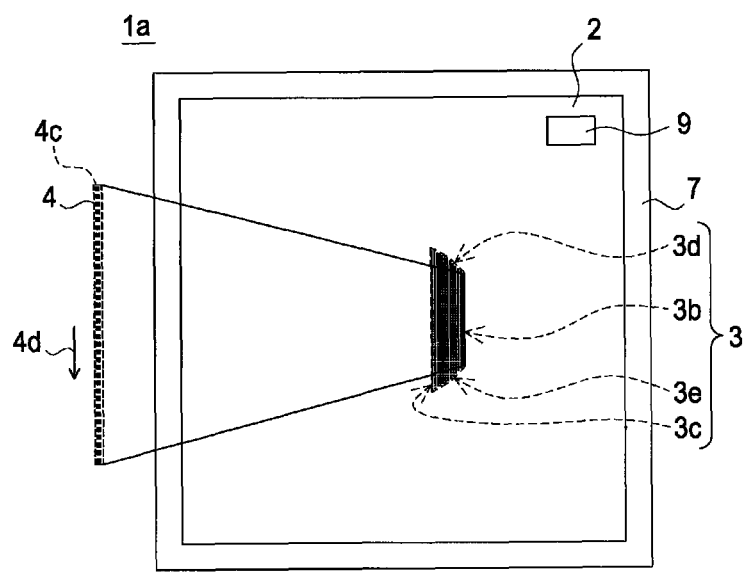
FIG. 2 shows that the aggregation of a plurality of semiconductor devices according to another embodiment.

FIG. 1A shows the aggregation 1 of a plurality of semiconductor devices 4. The aggregation 1 comprises a first layer 2 for carrying the plurality of semiconductor devices 4, a second layer 7 for covering the plurality semiconductor devices 4 and adhering to the first layer 2 such that the plurality of semiconductor devices 4 is between the first layer 2 and the second layer 7. The shape of the first layer 2 and/or the second layer 7 comprises rectangle, square, or circle. The plurality of semiconductor devices 4 is arranged by a sorter to form an arrangement 3 as approximately a circle or a regular polygon with the number of sides being greater than 4, e.g. a regular pentagon, hexagon, heptagon, octagon, etc. Namely, the perimeter of the arrangement 3 is approximately a circle or a regular polygon with the number of sides being greater than 4. The arrangement 3 is approximately at the center of the aggregation 1. In one embodiment, the shape of the arrangement 3 comprises a circle with a mark 3b, e.g. a flat side, for aligning the aggregation 1 in a tester or a sorter to a predetermined orientation. The shortest distance from the center of the arrangement 3 to the mark 3b is less than the radius of the arrangement 3. The mark 3b can also be a notch, or a mark that substantially break the continuity, smooth, or regularity of a circle or a regular polygon. The mark 3b is preferred parallel with one side of the first layer 2 or the second layer 7. FIG. 2 shows that the plurality of the semiconductor devices 4 is sequentially arranged from column to column by following the direction 4d, and the rightmost column 4c of the arrangement 3 composed of the mark 3b. In another embodiment, if the arrangement 3 is partially arranged, the shape of the arrangement 3 comprises the mark 3b, a second flat side 3c parallel to the mark 3b, and two opposite curves 3d, 3e connecting the mark 3b and the second flat side 3c. A tag 9 is on and at one corner of first layer 2. It is preferred that the tag 9 is at the up-right corner of the first layer 2 with the mark 3b being parallel with the left side of the first layer 2, for identifying the product information of the plurality of semiconductor devices 4, such as the bin code, the customer number, the wafer ID, . . . etc. The diameter 3a of the arrangement 3 is not greater than a predetermined value, e.g. 15 cm; or preferred not greater than 7 cm. The predetermined value may be limited by the process or equipment for testing, sorting, or packaging the semiconductor device 4 of the aggregation 1. The plurality of semiconductor devices 4 comprises chips diced from a wafer. The chips can be LED chips, photovoltaic chips, or other semiconductor chips. If the plurality of semiconductor devices 4 are LED chips, the method for forming the aggregation 1 comprises the steps of epitaxially forming an semiconductor light-emitting stacked layer on a substrate wafer, processing the semiconductor light-emitting stacked layer to form a plurality of chip regions and a plurality of first and second conductive pads, bonding the semiconductor light-emitting stacked layer to a supporter, such as a blue tape, and dicing the semiconductor light-emitting stacked layer, according to the plurality of chip regions, into individual LED chips each of which comprises a first conductive pad and a second conductive pad. Then, the LED chips are tested by a tester. Finally, the LED chips are sorted according to a testing result from the tester and a predetermined bin structure in a sorter into a variety of bin codes defined in the predetermined bin structure. The LED chips with the same bin code are arranged together within one arrangement, e.g. the arrangement 3 as shown in FIG. 1A. The predetermined bin structure is normally defined according to an electrical or luminous characteristic, e.g. radiation power, luminous flux, dominant wavelength, full width at half maximum(FWHM) of a luminous spectrum, color temperature, color rendering index, etc. The predetermined bin structure is normally defined by the manufacturer or a customer of the manufacturer. The process of a tester or a sorter is well-known for those skilled in the art, and is not necessary to be disclosed in detail.

Figure 1B:
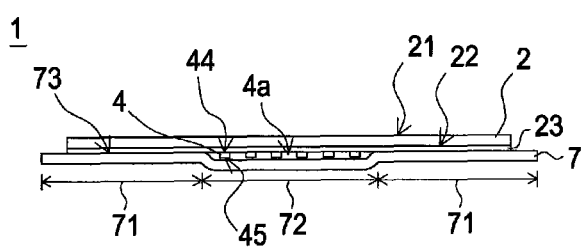

FIG. 1B shows the cross-section diagram of AA' of the aggregation 1 in FIG. 1A. The first layer 2 has a first surface 21 and a second surface 22, wherein the first surface 21 is non-adhesive. An adhesive glue layer 23 is formed on the second surface 22. The plurality of semiconductor devices 4 is adhered to the second surface 22 of the first layer 2 through the adhesive glue layer 23. The first layer 2 is capable of being expanded to over 2 times of the original area. The first layer 2 comprises a flexible material or polymer, such as PVC, PE, PP, PU, PEV, or the mixture thereof. The first layer 2 is preferably cut from a tape, such as blue tape. The second layer 7 comprises a third surface 73 facing the first layer 2. The third surface 73 comprises a first region 71 and a second region 72. The first region 71 is adhered to the second surface 22 of the first layer 2 through the adhesive glue layer 23. The second region 72 is on the plurality of semiconductor devices 4 and not adhered to the second surface 22 of the first layer 2. The second region 72 of the second layer 7 and the second surface 22 of the first layer 2 are not contacting with each other, and a space 4a is formed between adjacent two of the plurality of semiconductor devices 4. The second layer 7 is capable of being easily detached from the second surface 22 without damaging the third surface 73 and the adhesive glue layer 23. The second layer 7 comprises a paper, a plastic film, or glass. The material of the plastic film comprises BCB. The paper is preferably selected from the group consisting of Super-calendered Kraft paper (SCK), clay coated Kraft paper (CCK), machine finished Kraft paper (MFK), and machine glazed paper (MG). The material of the plastic film comprises polymer, or selected from the group consisting of PET, PP, HDPE, and LDPE. In one embodiment of the present disclosure, the second layer 7 is preferably a releasing paper.

Figure 1C:
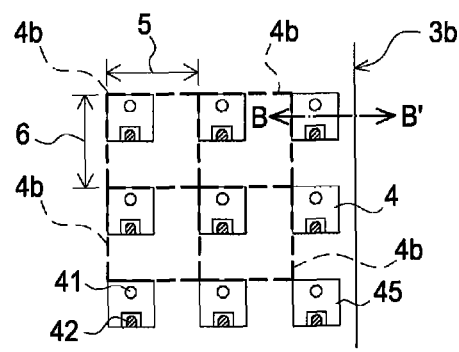

FIG. 1C shows the enlarge view of the region 8 in FIG. 1A. Each of the semiconductor devices 4 having an upper surface 45 and a back surface 44 opposite to the upper surface 45, wherein a first conductive pad 41 and a second conductive pad 42 are formed on the upper surface 45. The back surface 44 is adhered to the second surface 22 of the first layer 2 through the adhesive glue layer 23. The first conductive pad 41 and the second conductive pad 42 are used for electrical connecting, e.g. wire bonding, to an external device. The semiconductor devices 4 are aligned to each other, and each of the plurality of semiconductor devices 4 is allocated within a predetermined area 4b of the first layer 2, wherein the predetermined area 4b has a length 5 and a width 6. Each of the length 5 and the width 6 is between 50 um and 5 mm, and preferably between 100 um and 3 mm. The length 5 and the width 6 depend on the size of the semiconductor device 4, and can be the same or different from each other. For example, for the arrangement 3 with a diameter 3a of 7 cm, when the length 5 is about 1050 µm and the width 6 is about 500 µm, there are 7325 semiconductor devices in the arrangement 3. When the length 5 is about 500 µm and the width 6 is about 500 µm, there are 15384 semiconductor devices arranged in the arrangement 3. When the length 5 is about 800 µm and the width 6 is about 800 µm, there are 6009 semiconductor devices arranged in the arrangement 3.

TABLE 1

The number of the semiconductor devices in the arrangement with a diameter of 7 cm vs. different sizes of the deposit region

|  | The length of the pre-determined area | The width of the pre-determined area | The number of the semiconductor devices in the arrangement |
| --- | --- | --- | --- |
| Deposit region 1 | 1050 µm | 500 µm | 7325 |
| Deposit region 2 | 500 µm | 500 µm | 15384 |
| Deposit region 3 | 800 µm | 800 µm | 6009 |

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. An aggregation of semiconductor devices, comprising:
a first layer;
a second layer adhered to the first layer; and
a plurality of semiconductor devices arranged between the first layer and the second layer to form a shape,
wherein the shape comprises a curve and a mark, and the first layer is flexible,
wherein the first layer is capable of being expanded to over 2 times of the original area size of the first layer.

2. The aggregation of semiconductor devices according to claim 1, wherein the plurality of semiconductor devices comprises a LED chip or a photovoltaic chip.

3. The aggregation of semiconductor devices according to claim 1, wherein the mark comprises a flat side.

4. The aggregation of semiconductor devices according to claim 1, further comprises a tag on a corner of the first layer.

5. The aggregation of semiconductor devices according to claim 1, wherein the shape is approximately a circle.

6. The aggregation of semiconductor devices according to claim 1, wherein the farthest straight-line distance between any two points of the shape is not greater than 15 cm.

7. The aggregation of semiconductor devices according to claim 1, further comprises an adhesive glue layer on the first layer.

8. The aggregation of semiconductor devices according to claim 7, wherein the plurality of semiconductor devices is adhered to the adhesive glue layer.

9. The aggregation of semiconductor devices according to claim 7, wherein the first layer is adhered to the second layer by the adhesive glue layer.

10. The aggregation of semiconductor devices according to claim 7, wherein each of the plurality of semiconductor devices comprises a back surface and an upper surface, and the back surface is adhered to the adhesive glue layer.

11. The aggregation of semiconductor devices according to claim 10, wherein each of the plurality of semiconductor devices further comprises a conductive pad on the upper surface.

12. The aggregation of semiconductor devices according to claim 1, wherein the semiconductor devices are aligned to each other.

13. The aggregation of semiconductor devices according to claim 1, wherein a distance between adjacent two of the semiconductor devices is between 50 µm and 5 mm.

14. The aggregation of semiconductor devices according to claim 12, wherein the plurality of semiconductor devices is arranged as a column or multiple columns.

15. The aggregation of semiconductor devices according to claim 14, wherein the column or the columns are parallel to the mark.

16. The aggregation of semiconductor devices according to claim 1, wherein the material of the second layer comprises Supercalendered Kraft paper (SCK), clay coated Kraft paper (CCK), machine finished Kraft paper (MFK), machine glazed paper (MG), PVC, PE, PP, PU, PEV, or the mixture thereof.

17. The aggregation of semiconductor devices according to claim 1, wherein the first layer comprises a flexible material or polymer, such as PVC, PE, PP, PU, PEV, or the mixture thereof.

\* \* \* \* \*